(12) United States Patent
Chidambaram

(10) Patent No.: US 6,573,165 B2
(45) Date of Patent: Jun. 3, 2003

(54) METHOD OF PROVIDING POLYSILICON SPACER FOR IMPLANTATION

(75) Inventor: PR Chidambaram, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 20 days.

(21) Appl. No.: 10/184,520

(22) Filed: Jun. 28, 2002

(65) Prior Publication Data

US 2003/0008482 A1 Jan. 9, 2003

Related U.S. Application Data

(60) Provisional application No. 60/303,042, filed on Jul. 6, 2001.

(51) Int. Cl.[7] .............................................. H01L 21/425
(52) U.S. Cl. ....................................... 438/514; 438/241
(58) Field of Search ................................ 438/303, 305, 438/306, 514, 519, 527, 241, 258, 592, 682

(56) References Cited

U.S. PATENT DOCUMENTS 3,997,367 A * 12/1976 Yau
6,015,730 A * 1/2000 Wang et al.

* cited by examiner

*Primary Examiner*—David Nelms
*Assistant Examiner*—Phuc T. Dang
(74) *Attorney, Agent, or Firm*—Robert L. Troike; Frederick J. Telecky, Jr.

(57) ABSTRACT

An improved method of implanting source and drain for CMOS devices is provided by a hard mask and dry etching to form polysilicon gates 20 percent longer than desired, implanting to form the source and drain of the PMOS transistor with dopant that moves faster during annealing such as Boron and then wet etching the polysilicon gates down to the shorter length such as the final length before implanting with the faster dopant such as arsenic.

17 Claims, 3 Drawing Sheets

METHOD OF PROVIDING POLYSILICON SPACER FOR IMPLANTATION

This application claims priority under 35 USC §119(e)(1) of provisional application No. 60/303,042 filed Jul. 6, 2001.

FIELD OF INVENTION

This invention relates to CMOS processing and more particularly to using polysilicon as a spacer for implantation.

BACKGROUND OF INVENTION

Complementary Metal Oxide semiconductor (CMOS) technology employs both NMOS (n-channel transistor) and PMOS (p-channel transistor) to form logic elements. The structures and fabrication procedures are described in a book entitled "VLSI Technology, second edition edited by S. M. Sze, a McGraw Hill Publication (ISBN 0-07-062735-5). In particular, see section 11.4 beginning on page 483. The fabrication process for CMOS is similar to NMOS. Fabrication is also disclosed in many patents such as, for example, Hutter et al. U.S. Pat. No. 4,472,887. This patent is incorporated herein by reference.

The NMOS and PMOS differences occur due to individual doping adjustment for n-channel and p-channel devices. Twin tubs may be formed using lithographic mask process. A composite layer of silicon dioxide SiO2 and Silicon Nitride Si3N4 are defined and silicon is exposed over the n-tub region. Phosphorus is implanted as the n-tub dopant at low energy and enters the exposed silicon; but is masked from the adjacent region by the Silicon Nitride Si3N4. The wafers are then selectively oxidized over the n-tub regions. The nitride is stripped and Boron is implanted for the p-tub. The Boron enters the silicon through the oxide but is masked from the tub by the thicker SiO2 layer. All oxides are then stripped away and the two tubs are driven in by heat. After the tubs are formed, there is the formation of the field oxide and gates. The gate is polysilicon and is formed by a polysilicon deposit on the silicon base of the n-channel and p-channel. Photoresist is placed over the gate regions and etched. It is then necessary to selectively implant the n-channel and p-channel source/drain to form the n+ region for the n-channel and p+ regions for the p-channels. In accordance with one technique the implanting includes implanting Boron non-selectively into all sources and drains. This may then be followed with a selective implant. Phosphorus or Arsenic may be implanted in accordance with one technique into the n-channel source and drain regions at higher dose to overcome the Boron.

In the diffusion of the dopants during normal thermal processing (annealing), the dopants may diffuse closer to the gate than desired causing gate to drain overlap capacitance Cgd to increase more than desired. This causes a delay in the circuit performance. In the above example the Boron diffuses faster so the spacer is on the PMOS alone so the Boron implant is spaced out from the gate to allow more space for the Boron to diffuse. Similar diffusion with other dopants can occur requiring a spacer. It may also be desired to use a spacer for both dopants such as one for Arsenic in this the example.

It is desirable to reduce this capacitance. In a prior art process an additional spacer is placed on the PMOS which is nitride after the gate etch with the additional step of deposition/etch and NMOS mask before the Boron and Arsenic implants are done to form the source and drain.

SUMMARY OF INVENTION

In accordance with one embodiment of the present invention an improved process is provided wherein polysilicon gates are longer than the final gate length to provide a polysilicon spacer for implanting source and drain.

DESCRIPTION OF PREFERRED EMBODIMENTS OF THE PRESENT INVENTION

Figure 1:
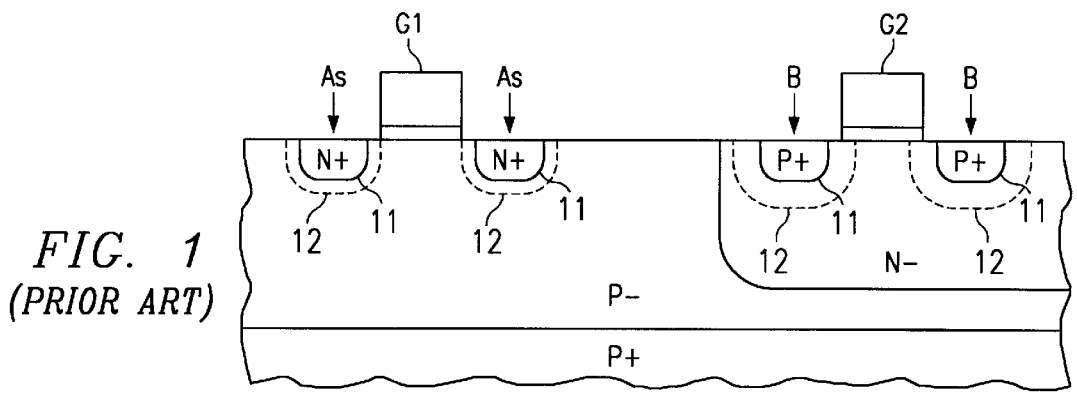
FIG. 1 illustrates the undesirable diffusion under the gate after diffusion in the prior art.

The two critical ways for reducing the overlap gate-to-drain capacitance are to decrease the thermal budget and to reduce the polysilicon overlap of the under diffusion. FIG. 1 illustrates the PMOS transistor on the right implanted on either side of the gate G2 with Boron (B), for example, to form the P+ regions on either side of the gate G2 for source and drain. The NMOS transistor on the left near the PMOS transistor, is implanted on either side of gate G1 with Arsenic (As), for example, to from the N+ regions for the source and drain on either side of the gate G1. The implanting adjacent to the gate G1 produces the N+ regions spaced from the gate G1 and the implanting adjacent to the gate G1 produces P+ regions spaced from the gate G2. Before diffusion the implanted regions are represented by the solid lines 11 in FIG. 1. In the heating or annealing process to drive in the Boron dopant and Arsenic dopant for example, the Boron diffuses faster than the arsenic (As) so the end result of the prior art is illustrated by the expanded areas indicated by the dashed lines 12 in FIG. 1 where the source and drain N+ regions of the NMOS transistor is aligned with the gate G1 but the P+ regions of the PMOS transistor overlaps too much of the polysilicon gate G2. This causes the overlap capacitance to increase more than desired.

Figure 2:
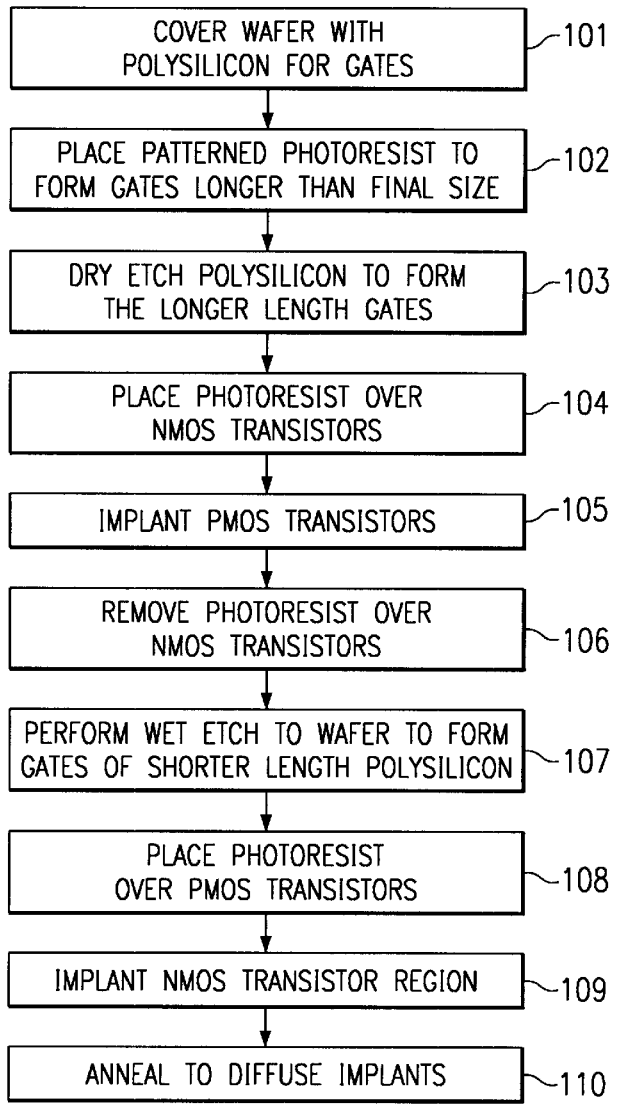
FIG. 2 illustrates the processing according to one embodiment of the present invention.
Figure 3A:
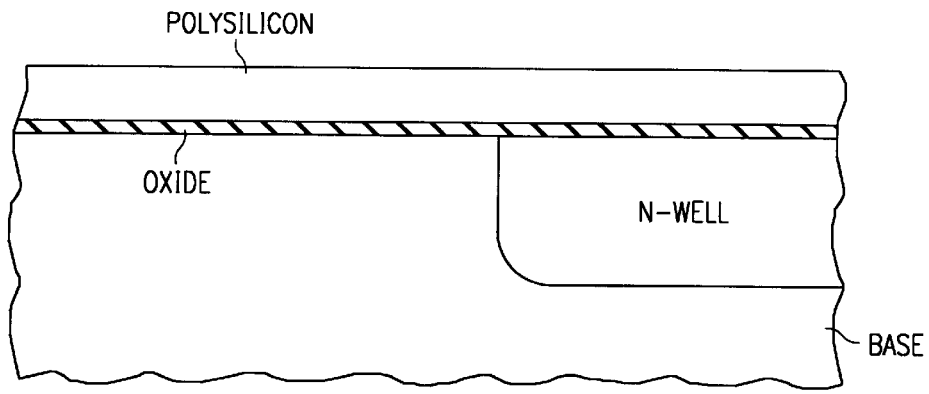
FIGS. 3a–3e illustrate the steps performed in the method of FIG. 2.
Figure 3B:
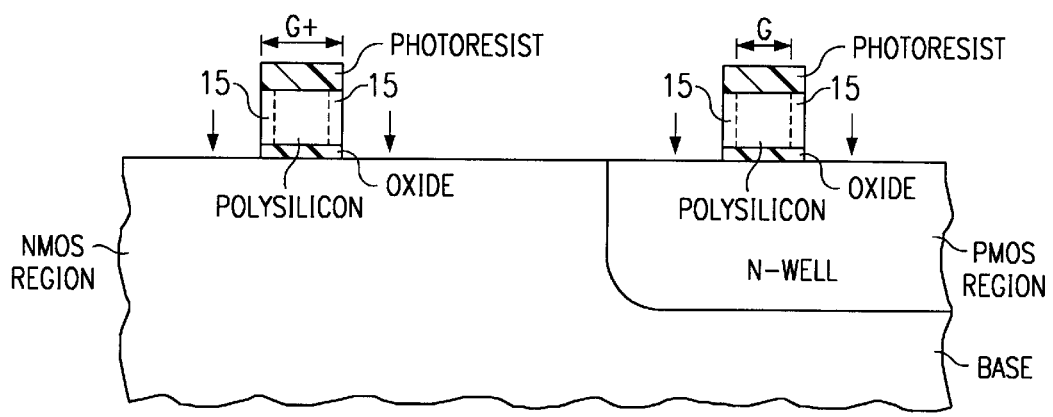
Figure 3C:
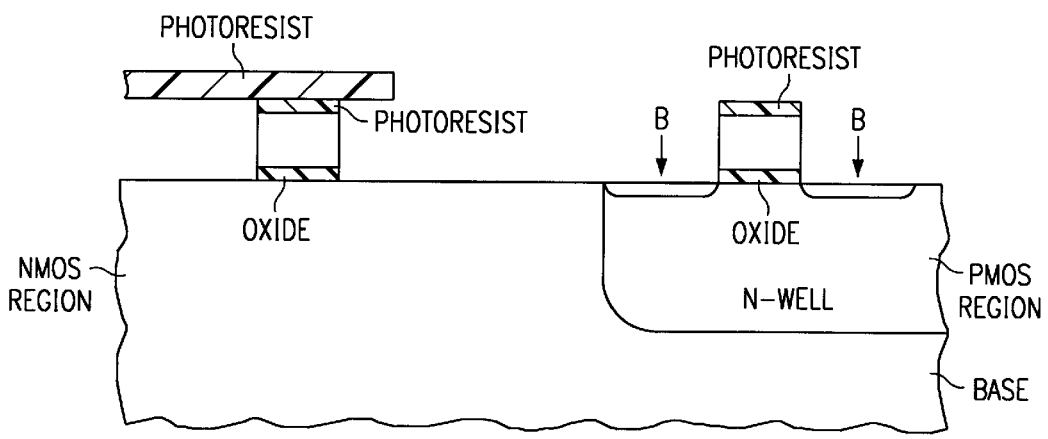
Figure 3D:
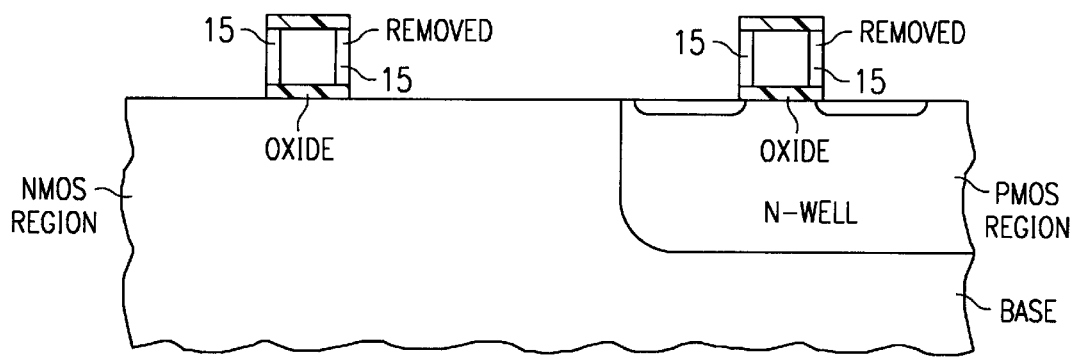
Figure 3E:
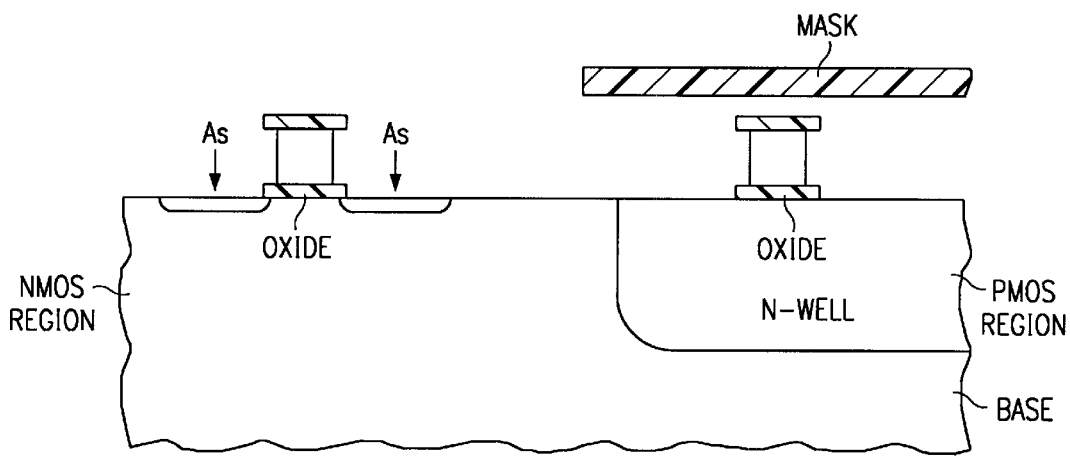

In accordance with the present invention a novel process is provided to prevent this without an additional mask over the PMOS by the process steps of FIG. 2. In this process in step 101 polysilicon covers the surface as illustrated by FIG. 3a. In step 102 hard mask photoresist covers the gate areas to form the gates longer (G+) than the desired final gates length (G) after implanting to form a spacer 15 of polysilicon. For example, the polysilicon gate length G+ is 0.20 percent longer than final gate length G. A dry etch such as dry reactive ion etch (RIE) is performed in step 103 that removes the polysilicon by the ion impact while not affecting the sides of the formed gates that are masked longer than the final gate length. This extra length forms the polysilicon spacer 15 from the desired gate. This is illustrated in FIG. 3b. The next step is to pattern photoresist over the NMOS transistor regions in step 104. Boron or other faster diffusing implant (faster with respect to a later implant such as arsenic) is then performed to form the source and drain in Step 105. This is illustrated in FIG. 3c. The photoresist is then removed over the NMOS transistor regions in step 106. A wet etch such as hot phosphoric acid is then applied in Step 107 to remove the polysilicon on the sides of the gates (spacers 15) or and the polysilicon gates are thinned to form the desired final gate length G. A wet etch does this even though the hard mask remains over the gates because the wet etch etches flows over the tops of the mask and down the sides to thin the gates. This is represented by the area marked removed in FIG. 3d and the thinned gates in FIG. 3e. The next step 108 is to place photoresist over the PMOS devices (FIG. 3d) and in Step 109 to implant the slower diffusing implant such as arsenic. This is illustrated in FIG. 3e. After this the whole wafer is annealed in step 110. Because of the polysilicon spacer the Boron or other faster diffusing implant is placed 20 percent further away from the final gate. This gives the Boron or other faster diffusing implant more area to move so as not to move undesirably under the gate during the annealing process. The Boron can move a greater distance and remain when the two implants are diffused. This resulted is reduced gate to drain capacitance because of the reduced polysilicon overlap.

In accordance with other embodiments the polysilicon spacer can be for one or both NMOS and PMOS implants to prevent dopants from diffusing too close to the final gate. In simulated case the reductions were 6.8% for NMOS and 15% for PMOS.

The dopants and the percentage of extra length are only by way of example. The dopants and the procedures are well know as taught for example in the Hutter et al. U.S. Pat. No. 5,472,887 incorporated herein by reference.

The teachings may be used in connection with low voltage and high voltage devices. The teaching may be used in source/drain extender steps. The use of polysilicon spacer can be used for other applications within the scope of the present invention. It should be appreciated that modifications or variations may be made to the system without departing from the scope of the invention. The scope of the, invention is set forth in the appended claims.

What is claimed is:

1. A method of performing implant for CMOS transistor fabrication comprising the steps of: providing long polysilicon gates longer than final gate lengths, implanting to form source and drain for PMOS transistors with faster diffusing dopants than used for NMOS transistors; trimming said polysilicon gates to a shorter gate length before implanting to form source and drain for NMOS transistors gates.

2. The method of claim 1 wherein said providing step includes providing a hard mask for said long gates and dry etching to form said longer polysilicon gates.

3. The method of claim 2 wherein said trimming step includes a wet etch removing the sides of the gates to their desired shorter gate length.

4. The method of claim 3 wherein the wet etch is hot phosphoric acid.

5. The method of claim 1 wherein said implanting to from said source and drain for said PMOS transistors is Boron implant.

6. The method of claim 3 wherein said implanting for NMOS transistors is arsenic implant.

7. The method of claim 2 wherein said dry etching leaves said long gates 20 percent longer than said final gate length.

8. The method of claim 1 including the step after implanting of annealing.

9. The method of claim 1 wherein said providing step provides the gates 20 percent longer than the final gate length.

10. The method of claim 1 including said step of annealing.

11. The method of claim 1 including the step of implanting for said NMOS transistors using arsenic.

12. A method of performing an implant for CMOS transistor fabrication comprising the steps of:
    forming an oversized hard mask over gate forming regions to provide a spacer on either side of a gate for implanting;
    implanting dopants on either side of said oversized hard mask and
    performing a wet etch removing said spacer to form the gate.

13. The method of claim 12 wherein the forming step includes using a dry etch to form the gate and spacer on either side of the gate.

14. The method of claim 12 wherein said oversized mask is oversized by 20 percent.

15. A method of performing an implant for CMOS transistor fabrication of two types wherein one type transistor has faster diffusion dopants than the other type transistor comprising the steps of:
    forming oversized hard mask over gate forming regions to provide a spacer on either side of gates for implanting;
    implanting dopants on either side of said oversized hard mask for the one transistor type with the faster diffusion dopant;
    performing a wet etch removing said spacer to form the gate; and
    implanting dopants on either said of said gate for the other type transistor.

16. The method of claim 15 wherein the forming step includes using a dry etch to form the gate and spacer on either side of the gate.

17. The method of claim 15 wherein said oversized mask is oversized by 20 percent.

* * * * *